United States Patent
Wang et al.

(10) Patent No.: US 8,586,764 B2
(45) Date of Patent: Nov. 19, 2013

(54) ORGANIC DYES AND PREPARATION METHOD THEREOF AND DYE-SENSITIZED SOLAR CELLS

(75) Inventors: Peng Wang, Changchun (CN); Yupeng Wang, Changchun (CN); Ning Cai, Changchun (CN); Wangdong Zeng, Changchun (CN); Mingfei Xu, Changchun (CN); Jingyuan Liu, Changchun (CN)

(73) Assignee: China National Academy of Nanotechnology and Engineering, Tianjin (CN)

( * ) Notice: Subject to any disclaimer, the term of this patent is extended or adjusted under 35 U.S.C. 154(b) by 0 days.

(21) Appl. No.: 13/383,308

(22) PCT Filed: Jul. 9, 2010

(86) PCT No.: PCT/CN2010/001019
§ 371 (c)(1),
(2), (4) Date: Feb. 22, 2012

(87) PCT Pub. No.: WO2011/003280
PCT Pub. Date: Jan. 13, 2011

(65) Prior Publication Data
US 2012/0138133 A1    Jun. 7, 2012

(30) Foreign Application Priority Data

Jul. 10, 2009    (CN) .......................... 2009 1 0069689

(51) Int. Cl.
*C07F 7/02* (2006.01)
*C07D 491/12* (2006.01)
*C07D 495/12* (2006.01)
*C07D 409/14* (2006.01)
*C07D 411/14* (2006.01)

(52) U.S. Cl.
USPC ............... 548/406; 548/430; 548/429; 549/4; 549/458

(58) Field of Classification Search
None
See application file for complete search history.

(56) References Cited

FOREIGN PATENT DOCUMENTS

CN        101240117 A  *  8/2008

OTHER PUBLICATIONS

Lin J. Org. Chem. (2010), 75, 4778-4785.*
International Search Report for PCT/CN2010/001019 mailed on Nov. 4, 2010.
Written Opinion for PCT/CN2010/001019 mailed on Nov. 4, 2010.

* cited by examiner

*Primary Examiner* — Nyeemah A Grazier
(74) *Attorney, Agent, or Firm* — Turocy & Watson, LLP (57) ABSTRACT

An organic dye and preparation method thereof and dye-sensitized solar cells using this organic dye are provided. The structure of the organic dye molecule is donor-conjugated unit(s)-acceptor. The organic dye with broad spectrum response and high molar-absorption coefficient is obtained by modifying the structure by using various conjugated unit(s) in combination with donor and acceptor. The conditions of preparation of the organic dye are mild and the yield is high, and the organic dye can be used for highly effective dye-sensitized solar cells.

13 Claims, 2 Drawing Sheets

ORGANIC DYES AND PREPARATION METHOD THEREOF AND DYE-SENSITIZED SOLAR CELLS

TECHNICAL FIELD

The present invention relates to an organic dye and a preparation method thereof and a dye-sensitized solar cell using this organic dye.

BACKGROUND

Among various reproducible energy sources, solar energy is one of the most desirable clean energy sources, and photoelectric conversion performed by the solar cells is one of the major ways to utilize the solar energy. In the family of solar cells, silicon solar cells dominate the major solar cell market shares due to its high conversion efficiency and mature technology. However, silicon solar cells suffer from the disadvantages of expensive raw materials and high production cost, etc. In 1991, Professor Grätzel at Eidgenossische Technische Hochschule Zürich reported a dye-sensitized solar cell with higher efficiency (Nature 1991, 353, 737). So far, the photoelectric conversion efficiency of the dye-sensitized solar cells has approached that of part of the silicon solar cells. The dye-sensitized solar cells have good application prospects because of low production cost, and are likely to replace silicon cells so as to occupy considerable solar cell market shares in the future. At present, dyes with the best performance are complexes containing noble metal, for example, polypyridyl ruthenium complexes (J. Am. Chem. Soc. 2008, 130, 10720-10728). However, the practical application of dyes containing noble metal is limited by the limited proved reserves of the noble metal. Compared to polypyridyl ruthenium complexes, organic dyes containing no notable metal show some advantages, such as low cost, high molar-absorption coefficient, and high structure modifiability.

SUMMARY OF INVENTION

In view of the foregoing, the inventors conducted intensive study, and found that, an organic dye with broad spectrum response and high molar-absorption coefficient can be obtained by modifying the structure by using various conjugated unit(s) in combination with donor and acceptor; the organic dye is a molecule having a donor-conjugated unit(s)-acceptor structure; the conditions for the preparation of the organic dye are mild and the yield is high, and the organic dye can be used for highly efficient dye-sensitized solar cells. Thus, the present invention is accomplished.

The object of the present invention is to provide an organic dye and a preparation method thereof and a dye-sensitized solar cell using this organic dye.

(1) The present invention relates to an organic dye having chemical formula 1 below:

wherein, $R_1$ and $R_2$ are any one of aromatic derivatives;

A is a electron withdrawing group, which is any one selected from cyano, halogenated hydrocarbyl, nitro, carboxyl, acyl, aldehyde group, amide group, or sulfonic group;

C is any one selected from carboxyl, amide group, phosphite, hypophosphite, sulfonate, hydroxyl, peroxy carboxylate, borate, or squarate.

(2) The organic dye according to (1), characterized in that, the $R_1$ is any one selected from formulae D~E below:

Formula D

Formula E wherein, $R_3$, $R_4$, $R_5$, $R_6$, $R_7$, and $R_8$ are independently any one selected from hydrogen atom, hydrocarbonoxy, hydrocarbonthio, hydrocarbyl, halogenated hydrocarbyl, hydroxyl, or amido.

Additionally, in a preferred embodiment, the numbers of carbon atoms in hydrocarbonoxy, hydrocarbonthio, hydrocarbyl, halogenated hydrocarbyl, or amido are independently preferably 1~20, more preferably 1~10, most preferably 1~6.

Further, the examples of halogenated hydrocarbyl are fluoro-hydrocarbyl, chloro-hydrocarbyl, bromo-hydrocarbyl, or iodo-hydrocarbyl.

(3) The organic dye according to (1), characterized in that, the $R_2$ is any one or more selected from formulae F~H below:

Formula F

Formula G

Formula H wherein, $R_9$~$R_{19}$ are independently any one selected from hydrogen atom, hydrocarbyl, hydrocarbonoxy, hydrocarbonthio, or halogenated hydrocarbyl; X, Z are independently selected from O, S, Se, or Te; n is an integer equal or greater than 1 but equal or less than 10.

Additionally, in a preferred embodiment, the numbers of carbon atoms in hydrocarbyl, hydrocarbonoxy, hydrocarbonthio, or halogenated hydrocarbyl are independently preferably 1~20, more preferably 1~10, most preferably 1~6.

Further, the examples for halogenated hydrocarbyl are fluoro-hydrocarbyl, chloro-hydrocarbyl, bromo-hydrocarbyl, or iodo-hydrocarbyl.

(4) The organic dye according to (1), characterized in that, it is any one selected from chemical formulae I~III below:

Chemical formula I

Chemical formula II

Chemical formula III (5) A method for producing the organic dye of (4), characterized in that, the method comprises a process for producing the organic dye by using the compound represented by chemical formula IV below as the starting material, Chemical formula IV wherein, Y represents iodine, bromine, or chlorine.

Hereafter, the dye-sensitized solar cell prepared by using the organic dye of the present invention will be described in detail.

Figure 1:
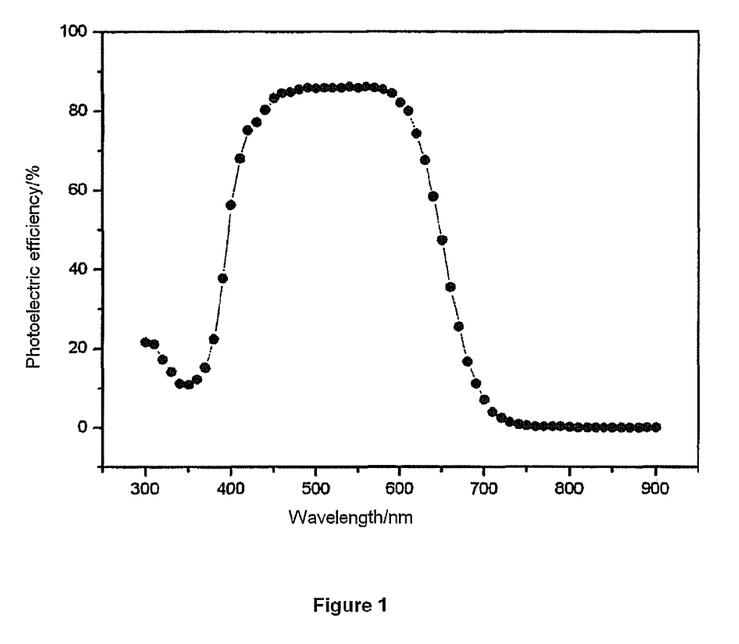
FIG. 1 is a graph showing the photoelectric conversion efficiency of the dye-sensitized solar cell prepared from the organic dye of chemical formula 1 of the present invention vs. wavelength.
Figure 2:
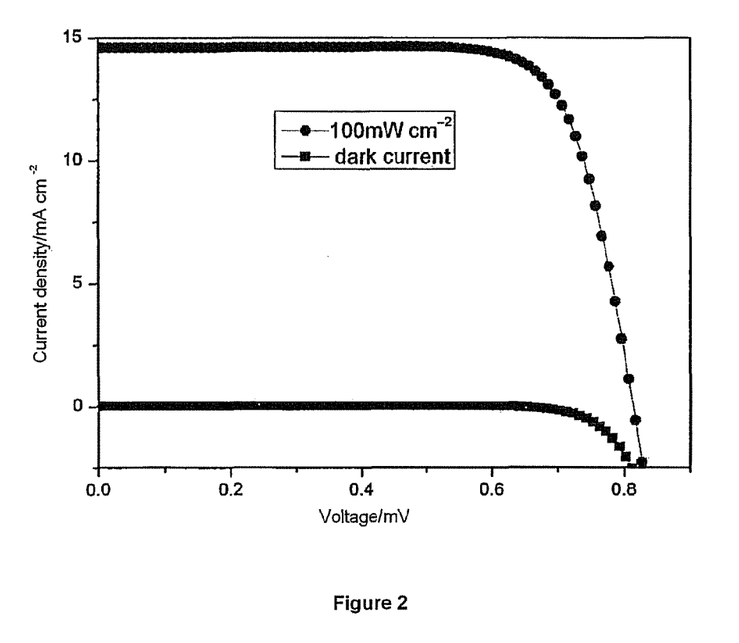
FIG. 2 is a graph showing the relationship between the current and the voltage of the dye-sensitized solar cell prepared from the organic dye of chemical formula 1 of the present invention.
Figure 3:
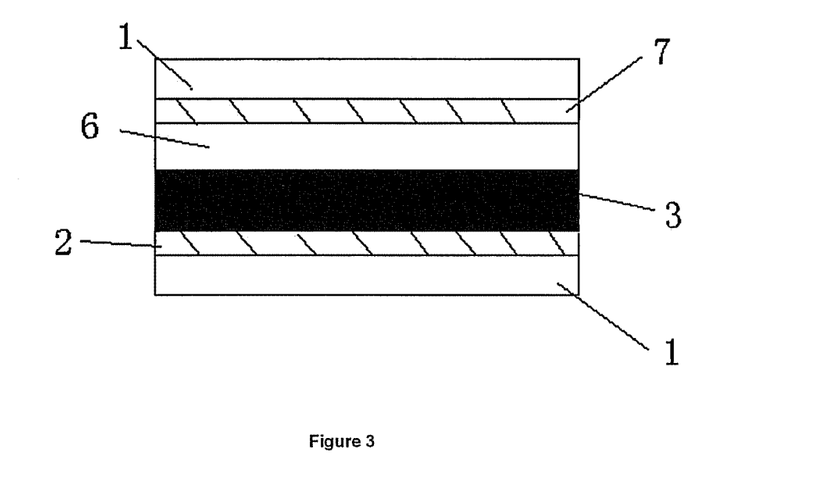
FIG. 3 is a structural schematic diagram of the dye-sensitized solar cell prepared from the organic dye, which is also the drawing for the abstract.
Figure 4:
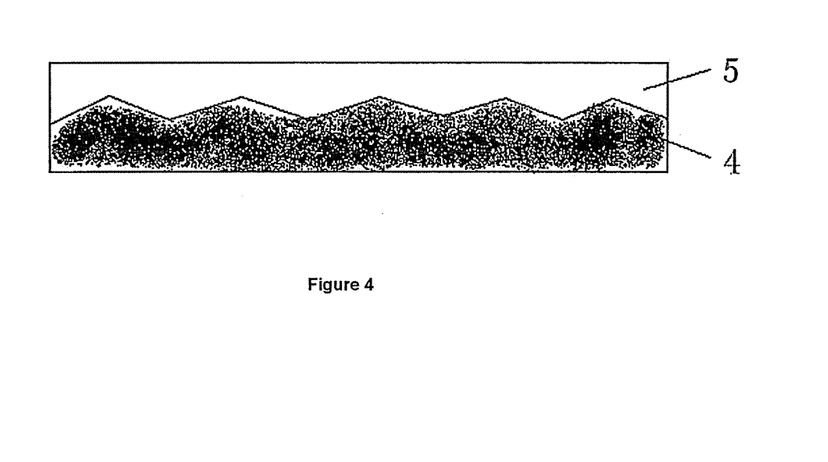
FIG. 4 is a structural schematic diagram of the light absorption layer 3, wherein, 4 indicates the semiconductor micro-nano particle layer, and 5 indicates the dye layer.

As shown in FIGS. 3 and 4, the dye-sensitized solar cell provided in the present invention is consisted of transparent substrate layers 1, a conductive layer 2, a light absorption layer 3, a hole transporting layer 6 and a counter electrode 7. The conductive layer 2, the light absorption layer 3, the hole transporting layer 6 and the counter electrode 7 are connected sequentially between the two transparent substrate layers. The light absorption layer 3 is consisted of a semiconductor micro-nano particle layer 4 and an organic dye layer 5. Wherein, the semiconductor micro-nano particle layer 4 is connected to the conductive layer 2, and the organic dye layer 5 is connected to the hole transporting layer 6. The organic dye layer is formed from the organic dye according to any one of (1)~(4).

The transparent substrate layers are formed from glass or plastic. The plastic is any one selected from polyethylene terephthalate, polyethylene naphthalate, polycarbonate, polypropylene, polyimide, triacetyl cellulose or polyethersulfone.

The conductive layer is formed from any one or more selected from tin-based oxide (e.g., fluorine doped tin oxide), indium-based oxide (e.g., tin doped indium oxide), zinc-based oxide (e.g., aluminum doped zinc oxide), and carbon-based (e.g., graphene, carbon nanotube, polyaniline, polypyrrole) transparent body.

The semiconductor micro-nano particles in the semiconductive micro-nano particle layer are any one selected from $TiO_2$, $SnO_2$, ZnO, $WO_3$, $Nb_2O_5$, $TiSrO_3$, and the average particle size of the semiconductor micro-nano particles is greater than 0 nm but equal or less than 100 μm.

The hole transporting layer is formed from any one or more selected from iodine/iodide salt electrolyte, ion liquid, and organic hole transporting material as well as inorganic hole transporting material.

The counter electrode is formed from any one or more selected from Pt, Au, Ni, Cu, Ag, In, Ru, Pd, Rh, Ir, Os, C and carbon-based conductive material. The carbon-based conductive material is any one or more selected from porous graphite, graphene, polyaniline, polypyrrole, and polythiophene.

Hereafter, the preparation of the above-mentioned dye-sensitized solar cell using the organic dye of the present invention will be described in detail.

The photoanode (light absorption layer) of the dye-sensitized solar cell employs double layers of $TiO_2$, wherein, the bottom film is formed from $TiO_2$ nanocrystal of 20 nm and has a thickness of 7 μm; the top film is formed from $TiO_2$ light scattering particles of 400 nm and has a thickness of 5 μm. The method for preparing $TiO_2$ nanocrystal and $TiO_2$-based nanostructure two-layered film electrode has been reported (Wang P. et al., Enhance the Performance of Dye-Sensitized Solar Cells by Co-grafting Amphiphilic Sensitizer and Hexadecylmalonic Acid on $TiO_2$ Nanocrystals, J. Phys. Chem. B., 2003, 107, 14336). The prepared $TiO_2$-based two-layered film is immersed into acetonitrile/t-butyl alcohol containing 300 μM organic dye of chemical formula 1 and 300 μM 3,7-dihydroxy-4-cholic acid for 12 hours. Then, a glass electrode covered with nano-platinum is sealed with the TiO$_2$-based nanostructure two-layered film electrode by heat melting via a hot melt ring with a thickness of 35 μm. Finally, electrolyte materials are impregnated into the space between the two electrodes. Thus, the dye-sensitized solar cell is formed.

The beneficial effect: The organic dye provided in the present invention is an organic dye with broad spectrum response and high molar-absorption coefficient. When such organic dye is applied to a dye-sensitized solar cell, the open circuit voltage of the cell reaches 816 mV, short circuit photocurrent reaches 14.59 mA/cm$^2$, and the power conversion efficiency reaches 9.1%.

The organic dye provided in the present invention has a simple synthesis process, low cost for the starting materials, and is easy for purification.

DETAILED DESCRIPTION OF THE INVENTION

EXAMPLE 1

Preparation of Organic Dye I

The synthesis route is as follows:

Synthesis of Intermediate 2:

In a reactor, 1.35 g compound 1 and 0.80 ml N,N-dimethylformamide were dissolved in 10 ml 1,2-dichloroethane. The reaction system was protected under Ar, and cooled to 0° C. 0.42 ml phosphorus oxychloride was added, and the reaction was performed at 0° C. for 4 hours. Then, 20 ml saturated sodium acetate aqueous solution was added, followed by stirring for 2 hours. Dichloromethane was used for extraction, and the organic phase was dried with anhydrous sodium sulfate. After removing solvent, the resultant was subject to column chromatography using dichloromethane/petroleum ether as the eluent to give intermediate 2 with a yield of 87%.

Synthesis of Intermediate 3:

In a reactor, 0.6 g intermediate 2 was dissolved in 45 ml tetrahydrofuran followed by being cooled to −78° C., and 0.31 g N-bromo-succinimide was added. The temperature was slowly raised to room temperature within a period of not less than 2 hours. After completion of the reaction, tetrahydrofuran was removed, and the resultant was subjected to column chromatography using dichloromethane as the eluent to give intermediate 3 with a yield of 99%.

Synthesis of Intermediate 5:

2 g intermediate 4, 0.933 g bis(pinacolato)diboron, 0.884 g potassium acetate, 0.091 g [1,1'-bis(diphenylphosphino)ferrocene]dichloropalladium, and 25 ml dimethyl sulfoxide were weighed in a glove box for ensuring water-free and oxygen-free, and were added to a reactor. The reaction system was protected under Ar, heated to 80° C. for reaction for 5.5 hours, followed by being cooled to room temperature and addition of 25 ml ethyl acetate. Then, the reaction system was washed with water, and dried with anhydrous sodium sulfate. After removing solvent, the resultant was subjected to column chromatography using toluene/n-hexane as the eluent to give intermediate 5 with a yield of 72%.

Synthesis of Intermediate 6:

In a reactor, 0.74 g intermediate 5 was dissolved in 40 ml tetrahydrofuran, and then 0.49 g intermediate 3 was added. Then, 1.09 g potassium carbonate was dissolved in 3.87 g water, and then added to the reaction system. The reaction system was protected under Ar, and after being stirred for 2 minutes, 0.08 g (triphenylphosphine)platinum was added followed by heating under reflux for 12 hours. After completion of the reaction, 40 ml water was added, and ethyl acetate was used for extraction. The organic phase was washed with saturated sodium bicarbonate aqueous solution, saturated sodium chloride aqueous solution in the same volume as the organic phase, and dried with anhydrous sodium sulfate. After removing solvent, the resultant was subjected to column chromatography using ethyl acetate/petroleum ether as the eluent to give intermediate 6 with a yield of 64%.

Synthesis of the Organic Dye I:

In a reactor, 0.16 g intermediate 6, 0.05 g cyano-acetic acid, and 0.14 ml piperidine were dissolved in 20 ml chloroform. The reaction system was protected under Ar, and heated under reflux for 18 hours. After completion of the reaction, 20 ml chloroform was added, and the organic phase was acidified with hydrochloric acid aqueous solution and washed with water for two times. After removing the organic solvent, the resultant was subjected to column chromatography using chloroform as the eluent to give the organic dye I with a yield of 89%.

NMR (nuclear magnetic resonance) data of the organic dye I:

$^1$H NMR (600 MHz, DMSO-d$_6$, δ$_H$): 13.29 (s, 1H), 8.41 (s, 1H), 7.93 (s, 1H), 7.52 (d, J=9.0 Hz, 2H), 7.48 (s, 1H), 7.03 (d, J=8.4 Hz, 4H), 6.92 (d, J=9.0 Hz, 4H), 6.77 (d, J=9.0 Hz, 2H), 3.94 (d, J=6.6 Hz, 4H), 1.88 (m, 4H), 1.70 (m, 4H), 1.41 (m, 4H), 1.31 (m, 8H), 1.10-1.13 (m, 12H), 0.87-0.89 (m, 10H), 0.77 (t, J=6.9 Hz, 6H).

$^{13}$C NMR (600 MHz, DMSO-d$_6$, δ$_C$): 164.36, 164.23, 157.11, 155.46, 150.29, 148.92, 148.44, 147.04, 139.30, 135.44, 133.06, 132.49, 126.81, 126.09, 125.20, 118.97, 117.31, 116.72, 115.39, 93.26, 67.57, 53.33, 37.22, 30.96, 30.89, 28.86, 28.67, 25.17, 23.96, 22.02, 21.92, 13.83, 13.74.

EXAMPLE 2

Preparation of Organic Dye II

The synthesis route is as follows:

Synthesis of Intermediate 8:

In a reactor, 1.87 g compound 7 and 0.96 ml N,N-dimethylformamide were dissolved in 100 ml 1,2-dichloroethane. The reaction system was protected under Ar, and cooled to 0° C. 0.96 ml phosphorus oxychloride was added, and the reaction was performed at 0° C. for 2 hours, and then at 40° C. for 4 hours. Then, 50 ml saturated sodium acetate aqueous solution was added, followed by stirring for 2 hours. Dichloromethane was used for extraction, and the organic phase was dried with anhydrous sodium sulfate. After removing solvent, the resultant was subjected to column chromatography using ethyl acetate/petroleum ether as the eluent to give intermediate 8 with a yield of 91%.

Synthesis of Intermediate 9:

In a reactor, 0.7 g intermediate 8 was dissolved in 45 ml tetrahydrofuran followed by being cooled to −78° C., and 0.52 g N-bromo-succinimide was added. The temperature was slowly raised to room temperature within a period of not less than 2 hours, and the reaction was performed at room temperature for 4 hours. After completion of the reaction, tetrahydrofuran was removed, and the resultant was subjected to column chromatography using ethyl acetate/petroleum ether as the eluent to give intermediate 9 with a yield of 80%.

Synthesis of Intermediate 10:

In a reactor, 0.51 g intermediate 5 was dissolved in 50 ml tetrahydrofuran, and then 0.28 g intermediate 9 was added. 0.85 g potassium carbonate was dissolved in 3.05 g water, and then added to the reaction system. After stirring for 2 minutes, 0.08 g (triphenylphosphine)platinum was added, followed by heating under reflux for 12 hours. After completion of the reaction, 50 ml water was added, and tricholormethane was used for extraction. The organic phase was washed with saturated sodium bicarbonate aqueous solution, saturated sodium chloride, and dried with anhydrous sodium sulfate. After removing solvent, the resultant was subjected to column chromatography using toluene as the eluent to give intermediate 10 with a yield of 84%.

Synthesis of the Organic Dye II:

In a reactor, 0.58 g intermediate 10, 0.201 g cyano-acetic acid, and 0.56 ml piperidine were dissolved in 30 ml chloroform. The reaction system was protected under Ar, and heated under reflux for 18 hours. After completion of the reaction, 30 ml chloroform was added, and the organic phase was acidified with hydrochloric acid aqueous solution and washed with water for two times. After removing the organic solvent, the resultant was subjected to column chromatography using chloroform as the eluent to give a dye, which was acidified with 2 mol/L hydrochloric acid aqueous solution and washed with water for two times again. After removing the organic solvent, n-hexane was used for recrystallization to give the organic dye II with a yield of 83%.

NMR data of the organic dye II: $^1$H NMR (400 MHz, DMSO-d$_6$, $\delta_H$): 13.32 (s, 1H), 8.42 (s, 1H), 8.12 (s, 1H), 7.64 (s, 1H), 7.55 (d, J=8.8 Hz, 2H), 7.05 (d, J=8.8 Hz, 4H), 6.92 (d, J=9.2 Hz, 4H), 6.79 (d, J=8.8 Hz, 2H), 4.29-4.31 (m, 2H), 3.94 (t, J=6.2 Hz, 4H), 1.82 (m, 2H), 1.66-1.72 (m, 4H), 1.39-1.42 (m, 4H), 1.30-1.33 (m, 8H), 1.26 (m, 6H), 0.88 (t, J=6.8 Hz, 6H), 0.81 (t, J=6.8 Hz, 3H).

$^{13}$C NMR (600 MHz, DMSO-d$_6$, $\delta_C$): 164.43, 155.50, 150.54, 148.53, 147.90, 147.52, 143.62, 139.30, 132.31, 126.93, 126.18, 125.64, 124.26, 122.69, 118.78, 117.45, 115.43, 112.44, 106.20, 93.09, 67.57, 46.60, 30.97, 30.69, 29.42, 28.67, 25.81, 25.18, 22.03, 21.93, 13.85, 13.77.

EXAMPLE 3

Preparation of Organic Dye III

The synthesis route is as follows:

-continued (14)

(15)

III

Synthesis of Intermediate 12:

In a reactor, 1 g compound 11 was dissolved in 84 ml tetrahydrofuran followed by being cooled to −78° C. The reaction system requires oxygen-free and water-free. 2.23 ml n-butyl lithium was added dropwisely, and the reaction was performed at −78° C. for 3 hours. 1.04 ml tributyl tin chloride was added dropwisely, and the reaction was performed at −78° C. for 30 mins and then at room temperature for 16 hours. 10 ml water was added to quench the reaction, and tetrahydrofuran was removed under reduced pressure. The aqueous phase was extracted with ethyl acetate, and the organic phase was dried with anhydrous sodium sulfate. After removing the solvent, intermediate 12 was obtained with a yield of 98%.

Synthesis of Intermediate 14:

In a reactor, 0.895 g intermediate 12, 1.34 g compound 13, and 0.1 g bis(triphenylphosphine)dichloropalladium were dissolved in 20 ml N,N-dimethylformamide. The reactor system was protected under Ar, heated up to 60°C. for reaction for 12 hours. After the completion of the reaction, 20 ml water was added, and chloroform was used for extraction. The organic phase was washed with saturated sodium chloride aqueous solution, water, and then dried with anhydrous sodium sulfate. After removing the solvent, the resultant was subjected to column chromatography using dichloromethane/n-hexane to give intermediate 14 with a yield of 66%.

Synthesis of Intermediate 15:

In a reactor, 0.3 g intermediate 14 and 2.88 ml N,N-dimethylformamide were dissolved in 30 ml 1,2-dichloroethane. The reaction system was protected under Ar, and cooled to 0° C. 0.06 ml phosphorus oxychloride was added, and the reaction was performed at 0° C. for 1 hour and at 80° C. for 12 hours. After being cooled to room temperature, 50 ml saturated sodium acetate aqueous solution was added, followed by stirring for 2 hours. Ethyl acetate was used for extraction, and the organic phase was dried with anhydrous sodium sulfate. After removing the solvent, the resultant was subjected to column chromatography using ethyl acetate/petroleum ether as the eluent to give intermediate 15 with a yield of 76%.

Synthesis of Organic Dye of Formula III:

In a reactor, 0.13 g intermediate 15, 0.038 g cyano-acetic acid, and 0.10 ml piperidine were dissolved in 15 ml chloroform. The reaction system was protected under Ar, and heated under reflux for 18 hours. After completion of the reaction, 15 ml chloroform was added, and the organic phase was acidified with hydrochloric acid aqueous solution and washed with water for two times. After removing the organic solvent, the resultant was subjected to column chromatography using chloroform as the eluent to give a dye, which was acidified with hydrochloric acid aqueous solution and washed with water for two times again. After removing the organic solvent, n-hexane was used for recrystallization to give the organic dye III with a yield of 87%.

NMR data of the organic dye III:

$^1$H NMR (400 MHz, DMSO-d$_6$, $\delta_H$): 13.50 (s, 1H), 8.47 (s, 1H), 8.02 (s, 1H), 7.50 (s, 1H), 7.49 (d, J=8.4 Hz, 2H), 7.03 (d, J=9.2 Hz, 4H), 6.91 (d, J=8.8 Hz, 4H), 6.75 (d, J=8.8 Hz, 2H), 3.93 (t, J=6.4 Hz, 4H), 1.68-1.71 (m, 4H), 1.37-1.44 (m, 4H), 1.30-1.32 (m, 12H), 1.23 (m, 4H), 1.17-1.18 (m, 8H), 0.964 (m, 4H), 0.89 (t, J=7 Hz, 6H), 0.79 (t, J=6.6 Hz, 6H).

$^{13}$C NMR (600 MHz, DMSO-d$_6$, $\delta_C$): 164.43, 155.50, 150.54, 148.53, 147.90, 147.52, 143.62, 139.30, 132.31, 126.93, 126.18, 125.64, 124.26, 122.69, 118.78, 117.45, 115.43, 112.44; 106.20, 93.09, 67.57, 46.60, 30.97, 30.69, 29.42, 28.67, 25.81, 25.18, 22.03, 21.93, 13.85, 13.77.

EXAMPLE 4

Dye-Sensitized Solar Cell Based on the Organic Dye I, II, or III

TiO$_2$ structure two-layered film electrode was immersed into acetonitrile/t-butyl alcohol containing 300 μM dye I, II or III and 300 μM 3,7-dihydroxy-4-cholic acid for 12 hours. Then, a glass electrode covered with nano-platinum was sealed with the TiO$_2$ nanostructure two-layered film electrode by heat melting via a hot melt ring with a thickness of 35 μm. Finally, electrolyte materials were impregnated into the space between the two electrodes. Thus, the dye-sensitized solar cell was formed. The parameters of the dye-sensitized solar cell obtained according to above method are set forth in the attached table of the specification. A detail method for preparing the elements is described in the reference (Wang P. et al., A Solvent-Free, SeCN$^-$/(SeCN)$_3^-$ Based Ionic Liquid Electrolyte for High-Efficiency Dye-Sensitized Nanocrystalline Solar Cell, J. Am. Chem. Soc., 126, 2004, 7164).

TABLE

Element measurement results of the sensitized solar cell prepared using the organic dye I~III

| Organic dyes | Open circuit voltage (mV) | Short circuit current (mA/cm$^2$) | filling factor FF | Efficiency (%) |
|---|---|---|---|---|
| I | 816.4 | 14.59 | 0.763 | 9.1 |
| II | 776.2 | 13.95 | 0.725 | 7.85 |
| III | 781.7 | 14.25 | 0.720 | 8.02 |

INDUSTRIAL APPLICABILITY

The organic dye provided in the present invention is an organic dye with broad spectrum absorption and high molar-absorption coefficient. The organic dye has a simple synthesis process, low cost for the starting materials, and is easy for purification. The dye-sensitized solar cell using the organic dye has excellent performances in open circuit voltage, short circuit photocurrent, and power conversion efficiency etc., and thus is applicable in industry.

The invention claimed is:

1. An organic dye having chemical formula 1:

formula 1 wherein, R₁ is Formula E

Formula E wherein R$_7$ and R$_8$ are independently any one group selected from hydrogen atom, hydrocarbonoxy, hydrocarbonthio, hydrocarbyl, halogenated hydrocarbyl, hydroxyl, or amido; and R₂ is Formula G Formula G or

Formula H wherein, R$_{13}$-R$_{19}$ are any one group selected from hydrogen atom, hydrocarbyl, hydrocarbonoxy, hydrocarbonthio, or halogenated hydrocarbyl; X and Z are independently selected from O, S, Se, or Te; n is an integer equal to or greater than 1 but equal or less than 10;

A is a electron withdrawing group, which is any one selected from cyano, halogenated hydrocarbyl, nitro, carboxyl, acyl, aldehyde group, amide group, or sulfonic group;

C is any one selected from carboxyl, amide group, phosphite, hypophosphite, sulfonate, hydroxyl, peroxy carboxylate, borate, or squarate.

2. The organic dye according to claim 1, wherein the organic dye is any one group selected from chemical formulae II-III below:

Chemical formula II

Chemical formula III

3. A method for producing the organic dye of claim 2, comprising a process for producing the organic dye by using the compound represented by chemical formula IV below as the starting material, Chemical formula IV wherein, Y represents iodine, bromine, or chlorine.

4. A dye-sensitized solar cell consists of a conductive layer, a light absorption layer, a hole transporting layer and a counter electrode connected sequentially between two transparent substrate layers;
the light absorption layer is formed from a semiconductor micro-nano particle layer and a dye layer; the semiconductor micro-nano particle layer is connected to the conductive layer, and the dye layer is connected to the hole transporting layer;
the dye layer is formed from the organic dye according to claim 1.

5. The dye-sensitized solar cell according to claim 4, wherein,
the transparent substrate layers are formed from glass or plastic.

6. The dye-sensitized solar cell according to claim 5, wherein,
the plastic is any one group selected from polyethylene terephthalate, polyethylene naphthalate, polycarbonate, polypropylene, polyimide, triacetyl cellulose or polyethersulfone.

7. The dye-sensitized solar cell according to claim 4, wherein,
the conductive layer is formed from any one or more group(s) selected from tin-based oxide, indium-based oxide, zinc-based oxide, or carbon-based transparent body.

8. The dye-sensitized solar cell according to claim 7, wherein,
the tin-based oxide is fluorine doped tin oxide,
the indium-based oxide is tin doped indium oxide,
the zinc-based oxide is aluminum doped zinc oxide,
the carbon-based is graphene, carbon nanotube, polyaniline, or polypyrrole.

9. The dye-sensitized solar cell according to claim 4, wherein,
the semiconductor micro-nano particles in the semiconductor micro-nano particle layer are any one group selected from $TiO_2$, $SnO_2$, $ZnO$, $WO_3$, $Nb_2O_5$, or $TiSrO_3$, and
the average particle size of the semiconductor micro-nano particles is greater than 0 nm but equal or less than 100 μm.

10. The dye-sensitized solar cell according to claim 4, wherein,
the hole transporting layer is formed from any one or more group(s) selected from iodine/iodide salt electrolyte, ion liquid, and organic hole transporting material or an inorganic hole transporting material.

11. The dye-sensitized solar cell according to claim 4, wherein,
the counter electrode is formed from one or more group(s) selected from Pt, Au, Ni, Cu, Ag, In, Ru, Pd, Rh, Ir, Os, C or carbon-based conductive material.

12. The dye-sensitized solar cell according to claim 11, wherein,
the carbon-based conductive material is any one or more group(s) selected from porous graphite, graphene, polyaniline, polypyrrole, or polythiophene.

13. A dye-sensitized solar cell, consisting of a conductive layer, a light absorption layer, a hole transporting layer and a counter electrode connected sequentially between two transparent substrate layers;
the light absorption layer is formed from a semiconductor micro-nano particle layer and a dye layer; the semiconductor micro-nano particle layer is connected to the conductive layer, and the dye layer is connected to the hole transporting layer;
the dye layer is formed from the organic dye according to claim 2.

* * * * *